United States Patent [19]
Hotta et al.

[11] Patent Number: 5,291,135
[45] Date of Patent: Mar. 1, 1994

[54] WEAK MAGNETIC FIELD MEASURING SYSTEM USING DC-SQUID MAGNETOMETER WITH BIAS CURRENT ADJUSTMENT AND/OR DETECTING FUNCTION OF ABNORMAL OPERATION

[75] Inventors: Masao Hotta, Hanno; Hisashi Kado, Kashiwa; Keiko Makie, Tokyo, all of Japan

[73] Assignees: Hitachi Ltd.; Director-General of the Agency of Industrial Science and Technology, both of Tokyo, Japan

[21] Appl. No.: 767,667

[22] Filed: Sep. 30, 1991

[30] Foreign Application Priority Data

Sep. 28, 1990 [JP] Japan ................. 2-256970
Sep. 28, 1990 [JP] Japan ................. 2-256974

[51] Int. Cl.$^5$ .......................................... G01R 33/035
[52] U.S. Cl. ............................. 324/248; 505/846
[58] Field of Search ................ 324/244, 245, 248; 505/842–846; 307/306; 128/653

[56] References Cited

U.S. PATENT DOCUMENTS

3,723,755   3/1973   Morse ................. 324/248 X
4,851,776   7/1989   Goto et al. ........... 324/248
4,977,896   12/1990  Robinson et al. ...... 324/248 X

OTHER PUBLICATIONS

Journal of Low Temperature Physics, vol. 25, Nos. ½, pp. 99–144, Mar. 1976.
"31-Channel DC SQUID Gradiometer Array for Biomagnetic Diagnosis", Abstracts of 1989 International Superconductivity Electronics Conference SS-1, (no month) 1989.
"Measurement of Somatosensory Evoked Magnetic Fields Induced by Electrical Simulation", The Journal of Japan Society of Applied Magnetism, vol. 13, No. 3, (no month) 1989, pp. 508–512.

*Primary Examiner*—Gerard R. Strecker
*Assistant Examiner*—Warren S. Edmonds
*Attorney, Agent, or Firm*—Antonelli, Terry, Stout & Kraus

[57] ABSTRACT

A multichannel weak magnetic field measuring system for neuromagnetic diagnosis is provided having a plurality of dc-SQUID magnetometers. Bias current setting circuits are provided for detecting an even harmonic component of the output across the terminals of the corresponding SQUID and automatically adjusting a DC bias current to the SQUID. Accordingly, the level of the component becomes a predetermined value. Circuitry is also included for equalizing the magnetic flux detection sensitivities of these dc-SQUID magnetometers. Abnormal operation detecting circuits are also provided for producing abnormal operation detected outputs when the level of the corresponding even harmonic component is smaller than a certain threshold value.

14 Claims, 7 Drawing Sheets

WEAK MAGNETIC FIELD MEASURING SYSTEM USING DC-SQUID MAGNETOMETER WITH BIAS CURRENT ADJUSTMENT AND/OR DETECTING FUNCTION OF ABNORMAL OPERATION

BACKGROUND OF THE INVENTION

This invention relates to a weak magnetic field measuring system having dc-biased SQUIDs (Superconducting Quantum Interference Devices), and particularly to a system for biomagnetic diagnosis.

The SQUID (Superconducting Quantum Interference Device) is a high-sensitivity magnetometer making use of the superconducting Josephson effect. Particularly, the dc-SQUID is widely used because of its low noise. Its structure and operation are disclosed in, for example, Journal of Low Temperature Physics, Vol. 25, Nos. $\frac{1}{2}$, pp 99, 1976.

On the other hand, a system has been published for simultaneously measuring a magnetic field at a plurality of measurement points by providing many SQUID magnetometers, as in, for example, "31-Channel DC SQUID Gradiometer Array for Biomagnetic Diagnosis" (Abstracts of 1989 International Superconductivity Electronics Conference SS-1 (1989)).

In addition, a method for signal source estimation by use of measured data from multi-channel magnetic field measuring system is presented in "Measurement of Somatosensory Evoked Magnetic Fields Induced by Electrical Stimulation", the Journal Magnetics Society of Japan, Vol. 13, No. 3, 1989, pp 508 ~512. According to this paper, the positions, strengths and directions of the current dipoles assumed within the head are determined to provide the minimum sum of square differences between the theoretical magnetic field distribution established on the surface of the head by the current dipoles and the experimental magnetic field distribution.

SUMMARY OF THE INVENTION

The dc-SQUIDs used in this weak magnetic field measuring system are affected in their detection sensitivity to the input magnetic flux by the bias currents to the SQUID rings. Therefore, the bias currents Ib are determined to provide the maximum output under the addition of a quasi-signal to the inputs. This makes the setting operation particularly in the measuring system having a plurality of dc-SQUIDs complicated and consuming time.

In addition, since the SQUID magnetometer utilizes super conduction, it causes a phenomenon called "magnetic trap" that a magnetic flux is trapped within the super conductor when a large magnetic field is applied or in other cases. When this magnetic trap is caused, the sensitivity of the magnetometer is greatly reduced. If the estimation of magnetic field sources is made under this abnormal state caused by a part of a plurality of SQUID magnetometers, the result of the estimation becomes erroneous. The prior art has no means for confirming the normal operation of the SQUID, and hence cannot decide whether the obtained result of the estimation of the magnetic field sources is reliable or not, that is, the prior art has poor reliability and low precision under the actual operation.

In view of the above aspects, it is an object of the invention to provide a SQUID magnetometer capable of simply setting the proper bias current Ib.

It is another object of the invention to provide a SQUID magnetometer capable of simply detecting the abnormal operation.

It is still another object of the invention to provide an arrangement for making it easy to equalize the sensitivities of a plurality of SQUID magnetometers.

It is further object of the invention to provide a weak magnetic field measuring system capable of accurately estimating the signal sources.

The even harmonic components of the voltage developed across the dc-SQUID terminals are not dependent on the presence or absence or magnitude of the input magnetic flux, and are proportional to the gradient of the V-Φ characteristic of the SQUID, or the sensitivity of the SQUID and the given modulation magnetic flux. Thus, according to this invention, means for detecting the even harmonic components, typically, double frequency (2F) component, of the voltage across the terminals of the SQUID is provided, and the output therefrom can be used for determining the bias current or deciding whether the operation of the SQUID magnetometer is abnormal or not.

According to this invention, there is provided a SQUID magnetometer having a SQUID ring including a plurality of Josephson junctions, modulating means for applying a modulation magnetic flux of a predetermined frequency to said SQUID ring, a bias current source for supplying a DC bias current to said SQUID ring, feedback means for detecting the level of a fundamental wave component of the voltage across the terminals of said SQUID ring as a magnetic flux detected output and feeding said level as a feedback signal back to said SQUID ring, thereby producing a detected output proportional to the magnitude of the input magnetic flux interlinking with the SQUID ring, means for detecting an even harmonic component of the voltage across the terminals of said SQUID ring, and current setting means for converging the value of the current from said bias current source so that the level of the even harmonic component becomes the maximum or around a reference value.

According to this invention, there is provided another SQUID magnetometer having a SQUID ring including a plurality of Josephson junctions, modulating means for applying a modulation magnetic flux of a predetermined frequency to said SQUID ring, a bias current source for supplying a DC bias current to said SQUID ring, feedback means for detecting the level of a fundamental wave component of the voltage across the terminals of said SQUID ring as a magnetic flux detected output and feeding said level as a feedback signal back to said SQUID ring, thereby producing a detected output proportional to the magnitude of the input magnetic flux interlinking with the SQUID ring, and abnormal operation detecting means for detecting an even harmonic component of the voltage across the terminals of the SQUID ring and producing an abnormal operation detected output when the level of the even harmonic component is lower than a predetermined threshold value.

When a plurality of these SQUID magnetometers are used to constitute a weak magnetic field measuring system, the effect of the invention is the greatest. For example, when each of a plurality of the SQUID magnetometers is added with the current setting means, the DC bias currents to the respective SQUID magnetometers are automatically set. Thus, the labor for initializing the system is greatly reduced. Also, if each current setting means is constructed to converge the bias current so that the level of the even harmonic component becomes a common reference value, the sensitivities of a plurality of SQUID magnetometers can be automatically made an equal constant value. Particularly, if this construction is used for the neuromagnetic diagnosis system for estimating the current distribution within the head from the magnetic flux data measured at a plurality of measurement points on the surface of the head of a living body, the accuracy of the estimation of the current distribution can be increased.

Moreover, if the abnormal operation detecting means is added to each of a plurality of SQUID magnetometers, the reliability of the system can be increased. Particularly, in the above neuromagnetic diagnosis system, erroneous magnetic flux detected data from the abnormal SQUID magnetometer which abnormally operates may be mixed into the estimation of the current distribution. Thus, if the abnormal operation detecting means is applied to the neuromagnetic diagnosis system, the magnetic flux detected output from the SQUID magnetometer of which the abnormal operation is detected by this abnormal operation detecting means can be excluded, and only the correct magnetic flux detected outputs from the normal SQUID magnetometers can be used for the estimation of the current distribution. Therefore, the neuromagnetic diagnosis system is able to always estimate the current distribution at high accuracy.

DESCRIPTION OF THE PREFERRED EMBODIMENTS

Figure 1:
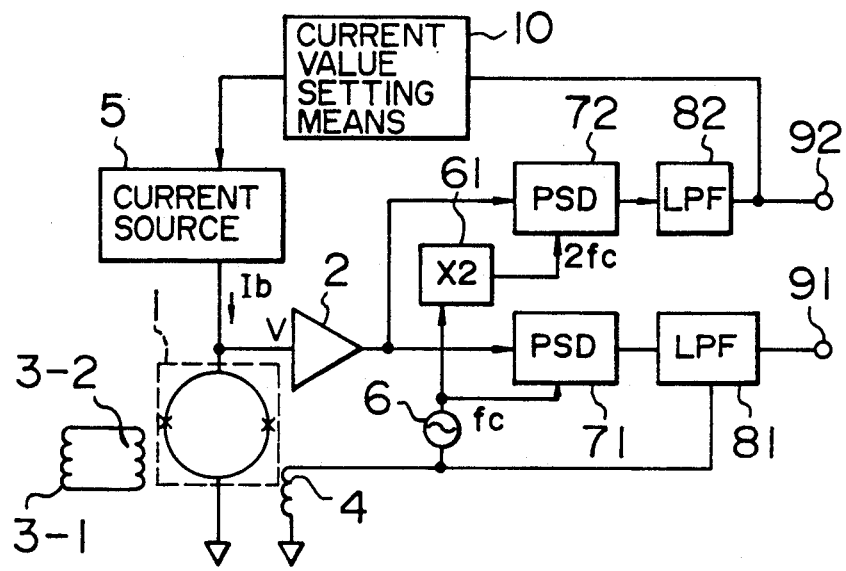
FIG. 1 is a block diagram of one embodiment of the invention.

FIG. 1 shows a first embodiment of the invention based on the above principle. Referring to FIG. 1, there is shown a SQUID ring 1 which has two Josephson junctions connected in parallel by a super-conducting wire. An input coil 3-1 is coupled with this SQUID ring 1 so that the magnetic flux picked up by a detection coil 3-1 is again induced in the input coil 3-1 and interlinked with the SQUID ring 1. An AC current of frequency fc generated from an oscillator 6 is flowed in a modulation-and-feedback coil 4 so that a modulation magnetic field of a constant amplitude $\Phi m$ is applied from the coil 4 to the ring 1. Also, a bias current Ib is supplied from a current source 5 to the SQUID ring 1. The voltage across the terminals of the SQUID ring 1 is amplified by an amplifier 2 and fed to a synchronous detection circuit 71 and then to a low-pass filter 81 so that the fundamental component of the modulated wave is detected, or that the output to the input can be obtained. In addition, this output is fed back to the SQUID ring 1 to maintain the magnetic field within the SQUID ring 1 constant. As a result, an output 91 becomes to a value proportional to the input magnetic flux.

This embodiment also has a circuit for the optimum bias setting as described below. The output of the amplifier 2 is also supplied to a synchronous detection circuit 72 which operates at a frequency 2 fc, twice as high as the frequency fc of the modulating wave. The output of the oscillator 6 is doubled by a frequency multiplier 61 into a signal of frequency 2 fc, which is supplied as a synchronous signal to the synchronous detection circuit 72. The output of the synchronous detection circuit 72 is supplied to a low-pass filter 82, which then produces a double frequency detected output 92 showing the magnitude of the double frequency component.

A current setting means 10 increases or decreases the value of the output current Ib of the current source 5 so as to converge so that the level of the double frequency detected output is the maximum value or around a preset reference value.

Figure 2A:
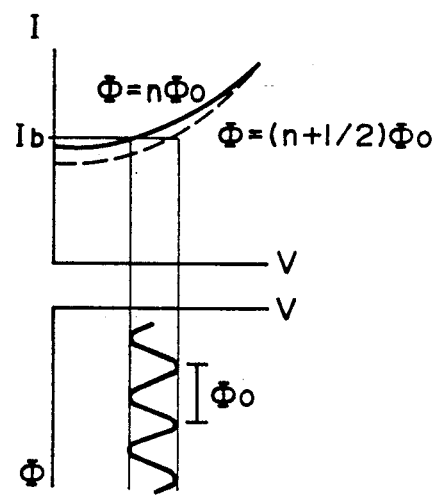
FIGS. 2A, 2B and 2C are characteristic diagrams of the dc-SQUID showing the principle of the operation of the invention.
Figure 2B:
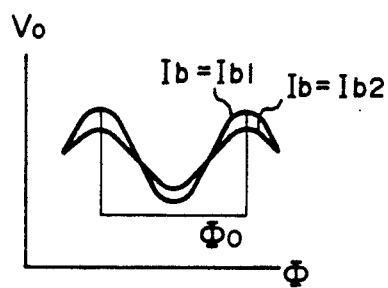
Figure 2C:
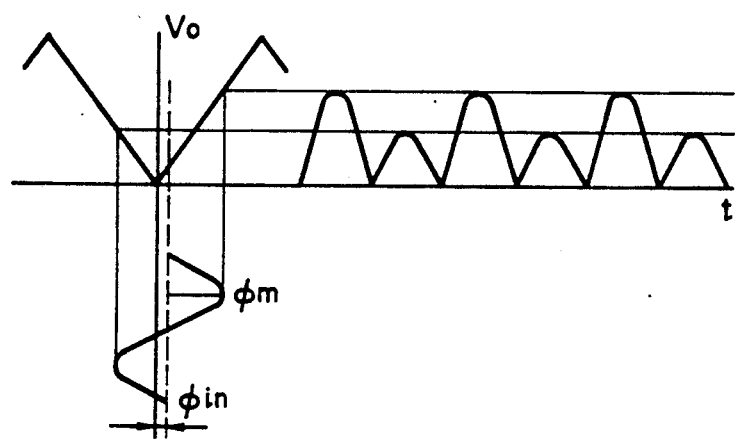

FIGS. 2A through C are diagrams showing the principle of this invention. The relation between the bias current Ib fed to the SQUID ring 1 and the voltage V across the terminals of the SQUID ring 1 is changed by the interlinked magnetic flux $\Phi$ with the ring 1 as shown in FIG. 2A. The relation between the interlinked magnetic flux $\Phi$ and the voltage V across the terminals of the ring with the bias current Ib maintained constant is called the V-$\Phi$ characteristic. As shown in FIG. 2A, V is a periodic function with respect to $\Phi$. The gradient of this V-$\Phi$ characteristic is the sensitivity to the input magnetic flux. The V-$\Phi$ characteristic is changed with the bias current Ib as shown in FIG. 2B. The V-$\Phi$ characteristic curve is approximated into a straight line for easy analysis as shown in FIG. 2C. On the other hand, a sine wave magnetic flux having the amplitude of 2 $\Phi m$ is applied as a modulating signal from the modulation coil 4 to the ring 1. In addition, if an input magnetic field $\Phi_{in}$ is applied to the SQUID ring 1, the voltage Vo across the terminals of the SQUID ring 1 becomes a half-wave waveform with alternate different amplitudes as shown in FIG. 2C. At this time, if each half waveform is approximated to be $\frac{1}{2}$ period of a sine wave of a different amplitude, the output voltage Vo(t) can be expressed in the corresponding Fourier series as given by the following equation (1).

$$V_o(t) = \frac{2K\phi_m}{\pi} + K\phi_{in}\sin\omega t - \frac{4K\phi_m}{\pi} \sum_{k=1}^{\infty} \frac{\cos 2k\omega t}{4k^2 - 1} \quad (1)$$

The double frequency component $V_{o2}(t)$ is expressed by $$V_{o2}(t) = \frac{4K\phi_m}{3\pi} \cos 2\omega t \quad (2)$$

Where K is the coefficient, showing the gradient of the V-$\Phi$ characteristic, or the sensitivity to the input magnetic flux. $\omega$ is the angular velocity of the modulating wave. From Eq. (1), it will be seen that the fundamental frequency component of the same frequency as the modulating wave is proportional to the input magnetic flux $\Phi_{in}$. Thus, the output 91 obtained through the amplifier 2, the synchronous detector 71, and the low-pass filter 81 shows the input magnetic flux. On the other hand, when considering the even harmonic component, particularly the double frequency component in Eq. (2), this component is constant irrespective of the input magnetic field, and proportional to the coefficient K and the magnitude $\Phi_m$ of the modulation magnetic flux. Here, $\Phi_m$ can be made constant and constant K is proportional to the gradient of the V-$\Phi$ characteristic, or the sensitivity. Accordingly, the situation of the V-$\Phi$ characteristic can be eventually known by the detection of this double frequency component.

Therefore, in the embodiment shown in FIG. 1, if the value of the bias current Ib is converged so that the level of the double frequency component obtained through the synchronous detector 72 and the low-pass filter 82 is the maximum or a reference value, the SQUID magnetometer can be made to have the maximum sensitivity or a predetermined sensitivity. Since this adjusting operation can be performed without the influence of the magnitude of the input magnetic flux from the input coil 3-2, it is not necessary to use the magnetic field source which serves as a reference for the setting of the bias current source.

Figure 3:
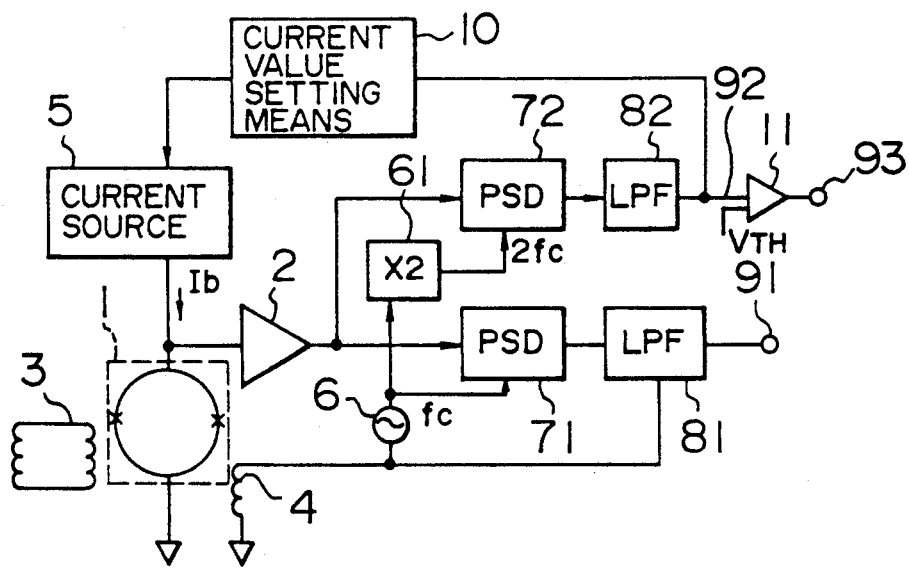
FIG. 3 is a block diagram of another embodiment of the invention.

FIG. 3 shows the second embodiment. This second embodiment is different from the first embodiment shown in FIG. 1 in that a level discrimination circuit 11 is added to the double frequency detected output 92 so as to discriminate the level variations of the output. This level discrimination circuit 11 may be specifically a comparator for detecting whether the level of the double frequency detected output 92 is lower than a threshold value $V_{TH}$, and producing an abnormal operation detected output 93 indicative of the abnormal operation of the SQUID when it is lower than the threshold value $V_{TH}$.

In general, the gradient K of the V-$\Phi$ characteristic of the SQUID is decreased, when the SQUID operating in an abnormal state due to the magnetic trap, and hence the amplitude of the double frequency component of the voltage $V_0$ across the terminals of the SQUID ring decreases. In the embodiment shown in FIG. 3, the occurrence of this abnormal operation is indicated by the output of the level discrimination circuit 11. During the period in which the current setting means 10 described with reference to FIG. 1 makes the adjusting operation for bias current, the abnormal operation detected output 93 may be sometimes generated for the SQUID magnetometer not in an abnormal state. Thus, during this adjusting operation, an inhibit circuit may be provided for inhibiting the abnormal operation detected output 93. Moreover, only for the purpose of generating the alarm for the abnormal operation, the current setting means 10 is not limited to the automatic setting of the bias current in accordance with the double frequency component detected output as in this embodiment, but may be replaced by a manually setting type.

Figure 4:
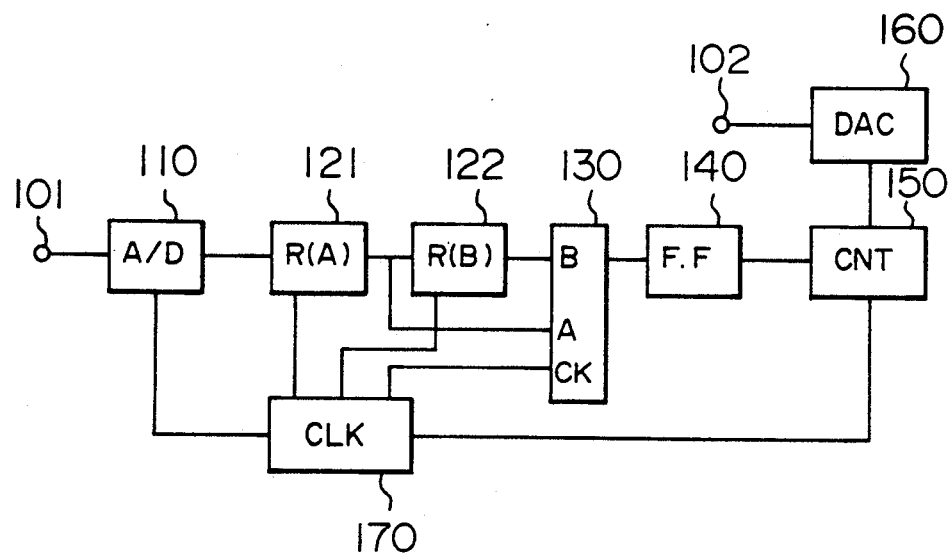
FIGS. 4 and 5 are a block diagram of an example of a main part of the embodiments, and a timing chart for the FIG. 6 is a block diagram of another example of the main part

FIG. 4 shows a first specific arrangement of the current setting means 10 provided as in FIGS. 1 and 3. Referring to FIG. 4, the double frequency detected output 92 indicative of the magnitude of the double frequency component is converted into a digital value by an A/D converter 110, and then stored in a register R(A) 121. At the next clock, the data in the register R(A) 121 is transferred to a register R(B) 122, and at the same time the next data is stored in the register R(A) 121. This data A and the data B one clock before are compared with each other by a comparator 130. Here, it is assumed that this comparator 130 generates "1" when A < B. In addition, a flip-flop 140 is driven by the compared output, and the output of the flip-flop 140 controls an up/down counter 150 to count up or down. The data from this counter 150 is supplied to the input of a D/A converter 160, thereby converted into an analog value, which is supplied to the input of the current source 5 shown in FIG. 1 or 3. The current source 5 thus generates a current proportional to this input signal. Shown at 170 is a clock generation circuit for supplying the clock to each circuit.

Figure 5:
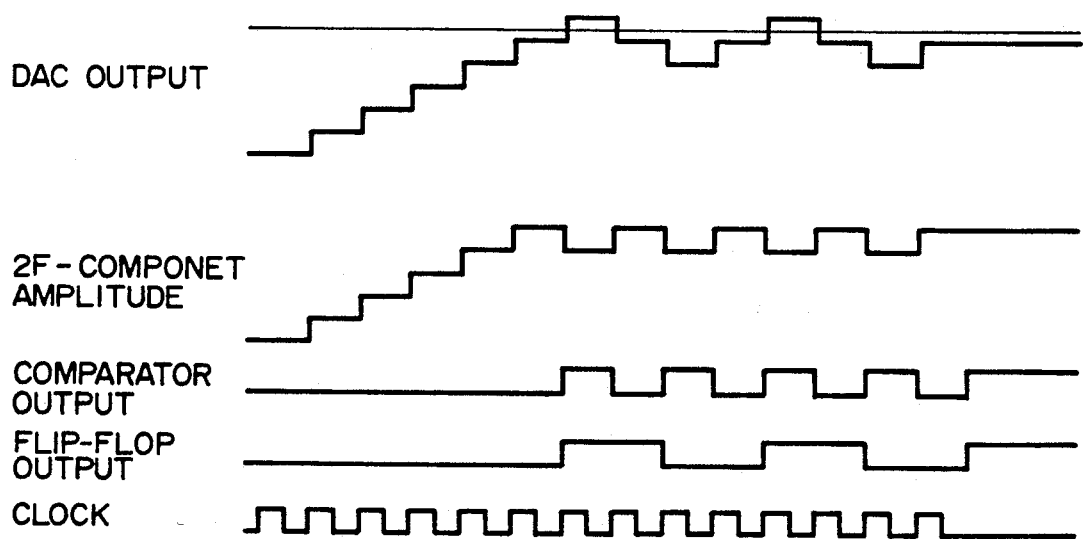

This current setting means will be further described in detail. It is assumed that the operation of each circuit in FIG. 4 is shown in FIG. 5. First, the registers 121, 122, the flip-flop 140 and the up/down counter 150 have been cleared into the initial state. Moreover, it is assumed that the up/down counter 150 counts up when the control signal is "0", and counts down when it is "1". Since the flip-flop 140 first produces output of "0", the up/down counter 150 counts up, and the output of the D/A converter 160 increases. The bias current to the SQUID ring 1 is also increased in proportion to the converter output. At this time, since the content of the register R(A) is larger than that of the resister R(B), or A > B, the output of the comparator 130 remains "0", and the output of the flip-flop 140 also remains "0". When the bias current is increased, the sensitivity of the SQUID becomes the maximum, or the magnitude of the double frequency component is the maximum, and then it is decreased. At this time, the register output A is smaller than the register output B, or A < B, and the compared output is "1". Thus, the output of the flip-flop 140 becomes "1", and the up/down counter 150 reversely counts down. The output of this counter changes the output of the D/A converter 160, thus decreasing the bias current to the SQUID ring. Then, the double frequency component again increases, and the register output A is larger than the register output B, or A > B with the result that the compared output is "0". At the next clock, the bias current decreases, and thus the double frequency component is decreased. The register output A is smaller than the register output B, or A < B, and the compared output is again "1". The output of the flip-flop 140 is "0", and the up/down counter 150 reversely counts up. Thereafter, the bias current is again increased, and the above operations are repeated. Therefore, the output of the D/A converter is converged at around the maximum double frequency component, or the maximum sensitivity. Thus, at this converged stage, the clock is stopped, or the input data to the D/A converter is fixed. For example, the clock generation circuit 170 having a timer incorporated is used, and stopped from generating the clock when a constant period has been elapsed from the start of the operation. By this construction, it is possible to automatically set the bias current to the SQUID ring at around the maximum sensitivity.

The register 121 in FIG. 4 may be an output latch included in the A/D converter.

Figure 6:
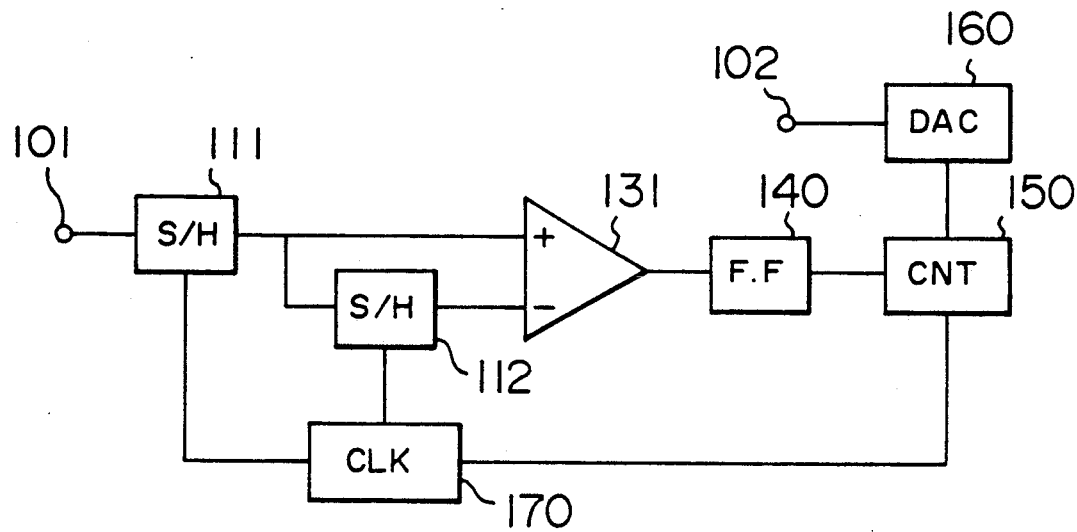

FIG. 6 is a second specific arrangement of the current setting means 10. This arrangement can make the above operations in an analog manner without the A/D converter. First, the double frequency detected output 92 is sampled by and its sampled value is held, in a sampleand-hold circuit (S/H) 111. At the next clock, the data in the S/H 111 is sampled by and its sampled value is held in a sample-and-hold circuit (S/H) 112, and at the same time the next data is sampled by the sample-and-hold circuit (S/H) 111. The data A and the data B one clock before are compared with each other by an analog comparator 131. The output of the comparator 131 drives the flip-flop 140, and the output of the flip-flop 140 controls the up/down counter 150 to count up or down similarly to the operation in FIG. 4. The operation of each circuit may also be considered to be the same as in FIG. 5. Since this current setting means does not need the A/D converter and the registers, the circuit arrangement is simple and consumes low power.

The above description is as to specific arrangements for automatic setting of bias current so that the double frequency component or the sensitivity of the SQUID is the maximum. However, when a number of SQUID magnetometers are used to measure, it is desired in some case that all the SQUID magnetometers be adjusted to have the same sensitivity rather than to have the respective maximum sensitivities. Thus, a description will be made of an embodiment for automatically adjusting all magnetometers to have the same sensitivity.

Figure 7:
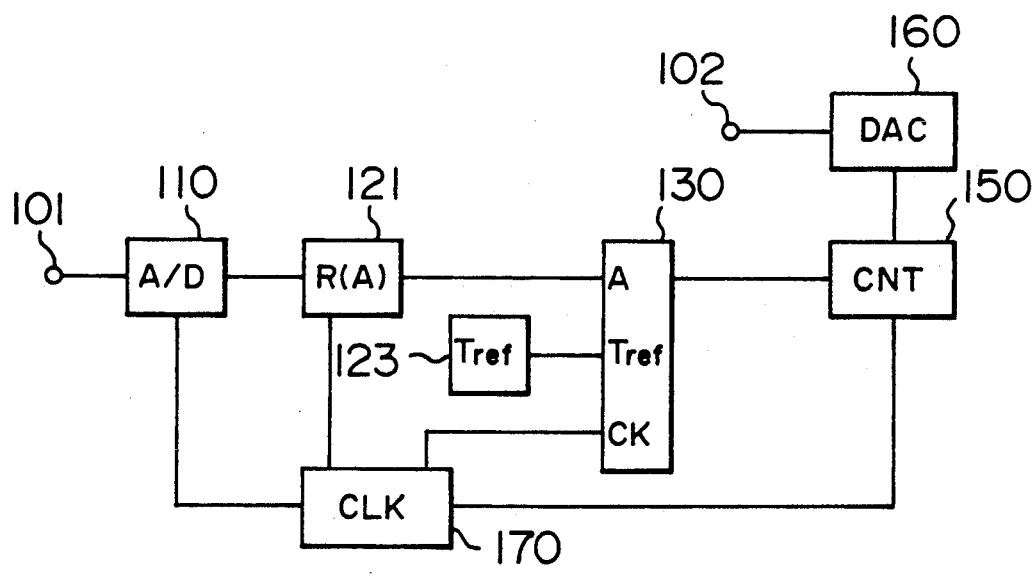
FIGS. 7 and 8 are a block diagram of still another example of the main part of the embodiments, and a timing the operation.

FIG. 7 shows a specific arrangement of the current setting means 10 for automatically adjusting the sensitivities to be constant. The operation of this arrangement will be mentioned with reference to FIG. 7. The double frequency detected output 92 is converted into a digital value by the A/D converter 110, and then temporarily held in the register R(A) 121. At the comparator 130 the data A is compared with a reference Value $T_{ref}$ which is generated from a reference value generation circuit 123. Here, it is assumed that the comparator 130 produces "1" $A > T_{ref}$. In addition, this compared output is used to control the up/down counter 150 to count up or down. The data from the counter 150 is supplied to the input of the D/A converter 160, thereby converted into an analog value, which is then supplied to the input of the current source 5 shown in FIGS. 2 and 3. The other portions are the same as in FIG. 4.

Figure 8:
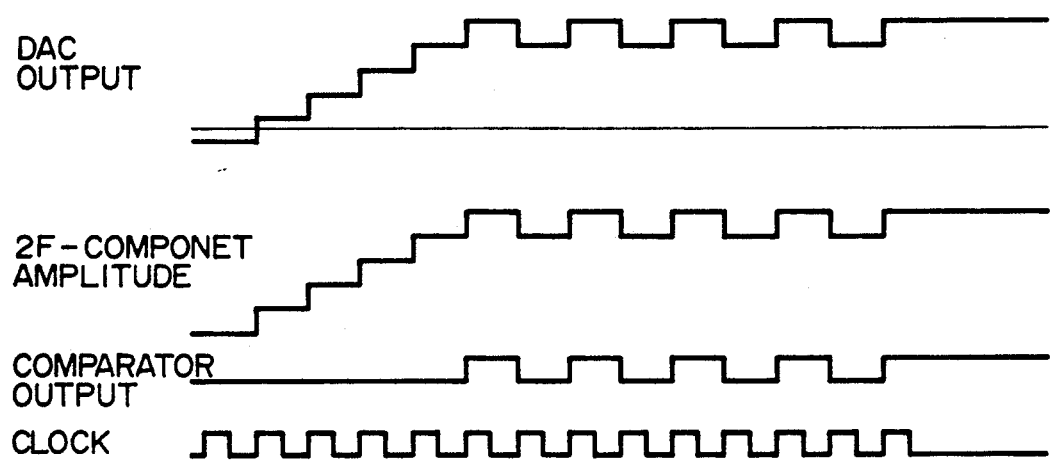

This current setting means will further be described in detail. The operation of each circuit in FIG. 7 is shown in FIG. 8. First, it is assumed that the register 121 and the up/down counter 150 have been cleared into the initial state. Since initially the register output A is smaller than the reference value $T_{ref}$, or $A < Tref$. Thus, since the output of the comparator 130 is "0", the up/down counter 150 counts up, and the output of the D/A converter is increased therewith. The bias current to the SQUID is also increased in proportion thereto. When the bias current and the sensitivity of the SQUID are increased, and when the magnitude of the double frequency component exceeds the reference value, the condition of $A > T_{ref}$ is satisfied and the output of the comparator is "1". Thus, the up/down counter 150 reversely counts down. The output of the counter changes the output of the D/A converter, decreasing the bias current to the SQUID ring. Then, the double frequency component is decreased, the condition of $A < T_{ref}$ is satisfied, and the comparator output becomes "0", with the result that the up/down counter 150 reversely counts up. Thereafter, the bias current is again increased, and the above operations are repeated. Therefore, the output of the D/A converter is converged at around a preset reference value. Thus, under this converged state, if the input data to the D/A converter is fixed by stopping the clock or other means, the bias current to the SQUID can be automatically set to make the sensitivity substantially constant.

In this case, the register 121 may be the output latch included in the A/D converter 110 similarly to the case of FIG. 4.

Figure 9:
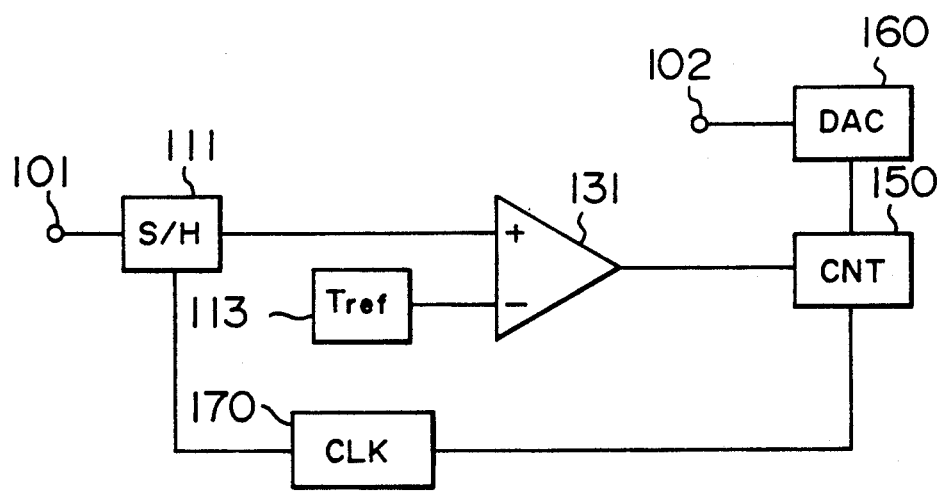
FIG. 9 is a block diagram of further example of the main part the embodiments.

FIG. 9 shows another specific arrangement of the current setting means 10 for automatically adjusting the sensitivity to be constant. In FIG. 9, the above operations are made in an analog manner without using the A/D converter as in FIG. 6. First, the double frequency detected output 92 is sampled by and the sampled value is held, in the sample-and-hold circuit (S/H) 111. This data A and the analog reference value generated from the reference value generation circuit 113 are compared with each other by the analog comparator 131. The output of this comparator 131 controls the up/down counter 150 to count up or down as in FIG. 7. Also, the operation of each circuit may be considered to be the same as in FIG. 8. Since this current setting means does not need the A/D converter and the registers, the circuit arrangement is simple and the power consumption is reduced as in FIG. 6.

Some specific arrangements of the current setting means have been described above in association with the first and second embodiments. It will be clear that the same operation as above can be performed by a computer such as a microcomputer.

Figure 10:
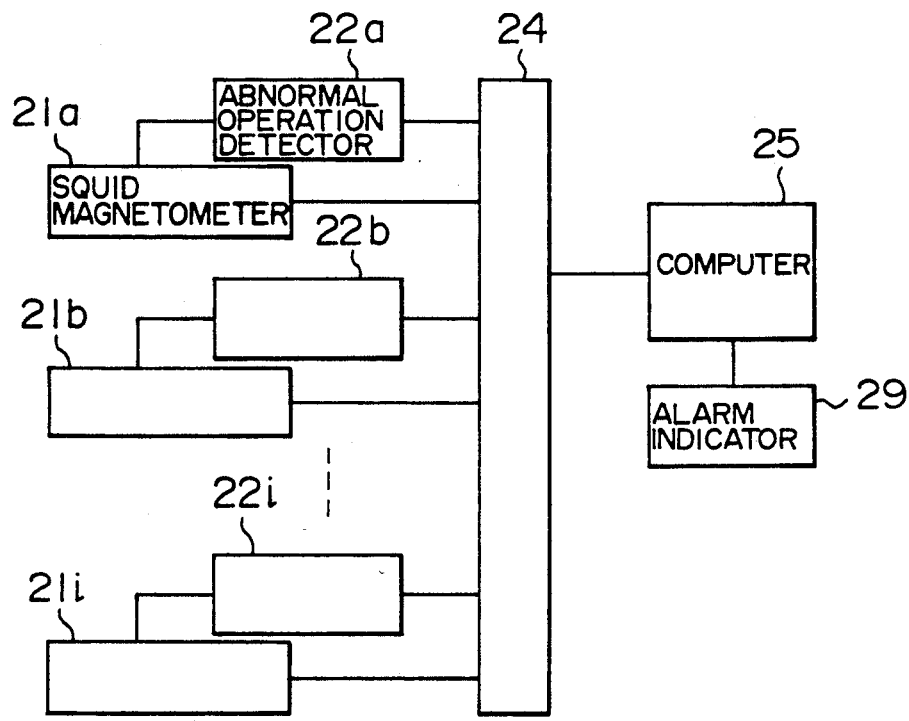
FIG. 10 is a block diagram of an embodiment of the invention applied to a neuromagnetic diagnosis system.

An embodiment of the neuromagnetic diagnosis system using the circuit arrangement shown in FIG. 3 will be described with reference to FIG. 10. Referring to FIG. 10, 21a to 21i each represent a SQUID magnetometer only showing the portion for producing the magnetic flux detected output at the terminal 91, of the SQUID magnetometer shown in FIG. 3. 22a to 22i each designate an abnormal operation detector of the SQUID magnetometer shown in FIG. 3. In other words, each of the abnormal operation detectors 22a to 22i corresponds to the section including the frequency multiplier 61, the synchronous detection circuit 72, the low-pass filter 82 and the comparator 11, and which produces an abnormal operation detected output when the level of the double frequency component of the output across the terminals of the SQUID ring of the SQUID magnetometer is lower than the threshold value. The detection coils of the respective SQUID magnetometers are dispersively disposed on the surface of the head to be examined.

The magnetic flux detection output and abnormal operation detection output of each magnetometer are supplied through an interface circuit 24 to a computer 25. The interface circuit 24 has A/D converters for the channels of the respective magnetometers. The magnetic flux detection output from each magnetometer is converted into a digital signal by the corresponding A/D converter, and added with one bit indicative of the presence or absence of the abnormal operation detected output. The computer 25 cyclically receives these digital signals and calculates the current distribution within the head from the data of the magnetic flux distribution on the surface of the head to be examined. As a typical method of computation, a plurality of current dipoles are assumed to be within the head, and the position, magnitude and direction of each current dipole are determined so as to minimize the sum of square differences between the theoretical magnetic distribution established from the assumed current dipoles and the measured magnetic fields at respective measurement points. This method is called the equivalent current dipole technique.

In this embodiment, the measured data from the SQUID magnetometers which produce the abnormal operation detected outputs are excluded, and only the measured data from the normal SQUID magnetometers are used to estimate the current distribution by the equivalent current dipole technique. Therefore, when any one or ones of the SQUID magnetometers make abnormal operation, the number of the field measurement points for use in the estimation of the current distribution is reduced the more. However, this embodiment is able to make higher precision estimation of current distribution than the use of incorrect data from the abnormal SQUID magnetometer. In addition, if current setting means for automatically adjusting the detection sensitivity to be constant as previously shown in FIGS. 7 to 9 is provided in each of the SQUID magnetometers 21a to 21i, the current distribution can be estimated at much higher precision. In this case, when the neuromagnetic diagnosis is actuated, the bias currents to the respective SQUID rings are individually adjusted so that the levels of the double frequency components of the outputs across the terminals of the SQUID rings of the SQUID magnetometers are around the reference value. If there are some SQUID magnetometers of which the double frequency components do not reach the above predetermined value even under the adjustment operation, abnormal operation detected outputs concerning those magnetometers are produced so that magnetic field data from them are excluded from data for estimation of current distribution.

Figure 11:
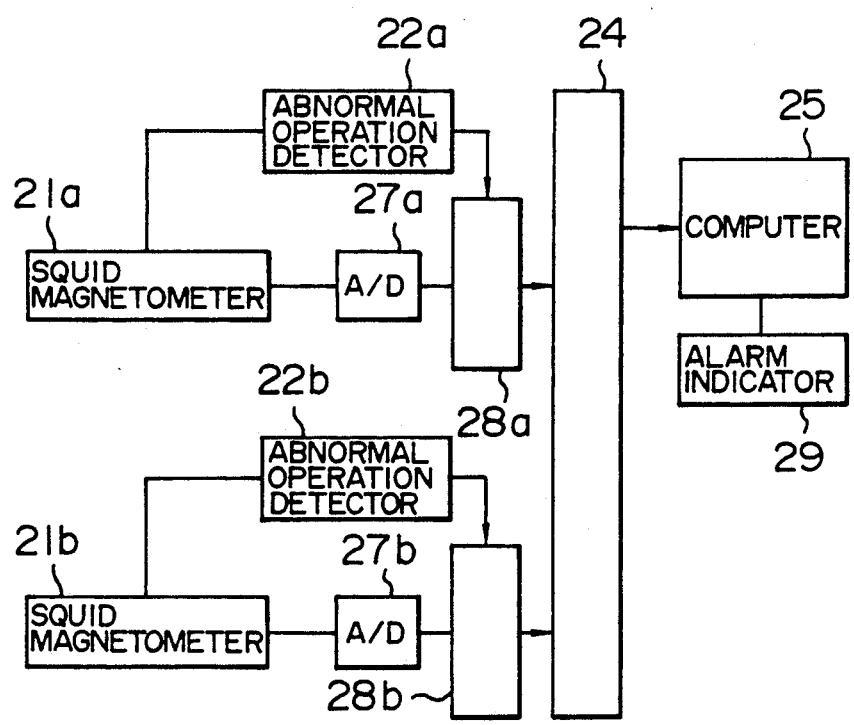
FIG. 11 is a block diagram of another embodiment of the diagnosis system.

FIG. 11 shows another embodiment of the neuromagnetic diagnosis system. In this embodiment, the A/D converters 27a, 27b for converting the magnetic flux detected outputs from the SQUID magnetometers 21a, 21b into digital signals are connected to registers 28a, 28b for holding the outputs, respectively. Each of these registers has a function to set "1" to all the bits in response to the abnormal operation detected output from the abnormal operation detector 22a or 22b. The computer 25 receives the register outputs from the interface 24, and decides the all-bit "1" data to be abnormal, excluding that data and the corresponding measurement points from the estimation of the current distribution. The function for setting "1" in all bits of the corresponding register in response to the alarm output may be replaced by the function for clearing all the bits of the corresponding register to be "0" in response to the alarm output, thus all-bit "0" data being regarded as abnormal data. Thus, information of whether the measured magnetic flux data is abnormal or not can be transmitted without increase of the number of bits of a signal on each channel.

Figure 12:
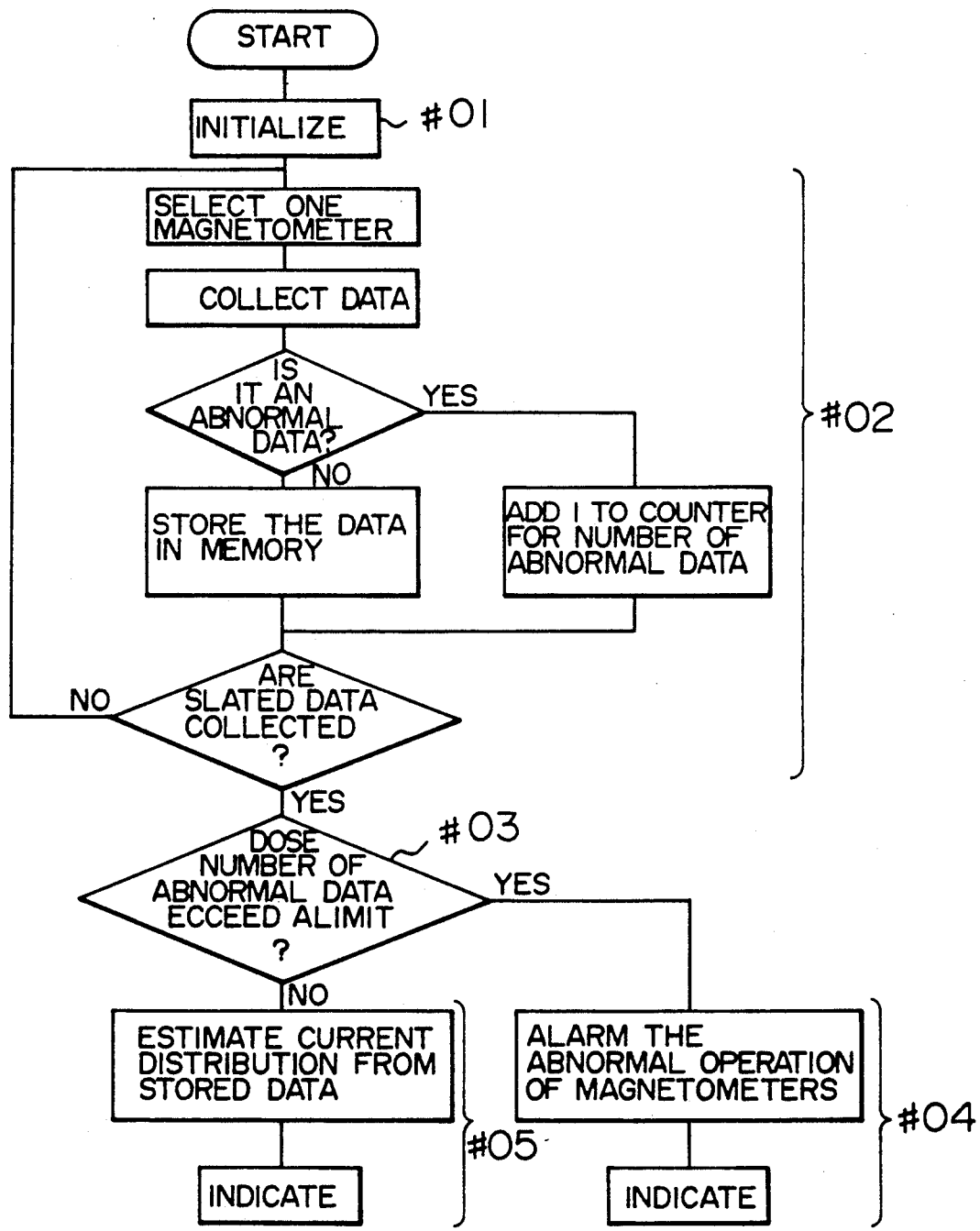
FIG. 12 is a flowchart for the processing flow in the embodiments of the neuromagnetic diagnosis system.

As described above, since the data to be received by the computer are modified by the outputs from the abnormal operation detectors, the data from the abnormal SQUID magnetometer can be excluded from the estimation of the magnetic field sources. In this case, a small number of abnormal SQUIDs little affect the estimation, but a large number of abnormal SQUIDs increases the error in the estimation. Thus, if the number of abnormal SQUIDs exceeds a predetermined value, an alarm is issued to the operator or the estimation for the current distribution is stopped, so that the erroneous results can be checked. A specific example of this case will be described with reference to the flowchart of FIG. 12.

When the neuromagnetic diagnosis system is operated, the current setting means, as described with reference to FIGS. 7 to 9, performs initialization including the setting of bias currents to the respective SQUID magnetometers (step #01). Then, the computer 25 permits the incorporated memory to sequentially store the data of the SQUID magnetometers, and at the same time, it accumulates the number of data having the abnormal operation detected output added (step #02). When all the predetermined data are completely received, the computer 25 decides whether the number of the accumulated abnormal data has exceeded an allowable value (step #03). If the number of abnormal data has exceeded the allowable value, the computer 25 issues an alarm signal to an alarm indicator 29 shown in FIG. 10 or 11, thus the alarm being displayed thereon (step #04). If the number of abnormal data does not exceed the allowable value, the computer 25 calculates the magnetic field sources by use of the data with no abnormal operation detected output of the stored data, and permits the result to be displayed on a proper output device not shown (step #05).

As described in the above embodiments, the frequency component of double the frequency of the modulation magnetic flux can be extracted from the output across the terminals of the de-SQUID and used for the automatic setting of DC bias currents or detection of abnormal operation. In this case, the even harmonic component can also be used exactly in the same way as the double frequency component. Other various different changes and modifications are possible.

What is claimed is:

1. A SQUID magnetometer including:
   a SQUID ring, including a plurality of more than two Josephson junctions, which is applied with a magnetic flux being measured;
   modulating means for applying a modulation magnetic flux of a predetermined frequency to said SQUID ring to modulate the SQUID ring;
   a bias current source for supplying a DC bias current to said SQUID ring;
   feedback means for detecting the level of a fundamental wave component of a modulated voltage across the terminals of said SQUID ring as a magnetic flux detected output and feeding a feedback flux corresponding to said level back to said SQUID ring;
   means for detecting an even harmonic component of the modulated voltage across the terminals of said SQUID ring; and
   current setting means for adjusting the value of the current from said bias current source so that a peak level or a root-mean square of said even harmonic component of a voltage generated between terminals of the SQUID ring becomes the maximum value or a preset reference value.

2. A SQUID magnetometer according to claim 1, wherein said current setting means performs an adjustment operation for the current value from said bias current source for a certain period, and then fixes said current value.

3. A SQUID magnetometer according to claim 2, wherein said current setting means includes control signal changing means for periodically increasing or decreasing a control signal for specifying the current value from said bias current source, means for sequentially sampling the output of said even harmonic component detecting means, means for comparing the newest sampled value and the previous sampled value and selecting the next operation of said control signal changing means in accordance with the compared result, and means for detecting the lapse of a constant period and stopping the operation of said control signal changing means.

4. A SQUID magnetometer according to claim 3, wherein said control signal changing means is an up/down counter which is supplied with a clock signal and counts up or down said clock signal in accordance with the selection operation of said operation selecting means.

5. A SQUID magnetometer according to claim 2, wherein said current setting means includes control signal changing means for periodically increasing or decreasing the control signal for specifying the current value of said bias current source, means for sequentially sampling the output of said even harmonic component detecting means, means for comparing said sampled value and a predetermined value and selecting the next operation of said control signal changing means in accordance with the compared result, and means for detecting the lapse of a constant period and stopping the operation of said control signal changing means.

6. A SQUID magnetometer according to claim 5, wherein said control signal changing means is an up/-down counter which is supplied with a clock signal and counts said clock up or down in accordance with the selection operation of said operation selecting means.

7. A SQUID magnetometer including:
a SQUID ring, including a plurality of more than two Josephson junctions, which is applied with a magnetic flux being measured;
modulating means for applying a modulation magnetic flux of a predetermined frequency to said SQUID ring to modulate the SQUID ring;
a bias current source for supplying a DC bias current to said SQUID ring;
feedback means for detecting the level of a fundamental wave component of a modulated voltage across the terminals of said SQUID ring as a detected output and feeding a feedback flux corresponding to said level back to said SQUID ring; and
abnormal operation detecting means for detecting the even harmonic component of the modulated voltage across the terminals of said SQUID ring, and producing an abnormal operation detected output when said level is lower than a predetermined threshold value.

8. A SQUID magnetometer including:
a SQUID ring, including a plurality of more than two Josephson junctions, which is applied with a magnetic flux being measured;
modulating means for applying a modulation magnetic flux of a predetermined frequency to said SQUID ring to modulate the SQUID ring;
a bias current source for supplying a DC bias current to said SQUID ring;
feedback means for detecting the level of a fundamental wave component of a modulated voltage across the terminals of said SQUID ring as a magnetic flux detected output and feeding a feedback flux corresponding to said level back to said SQUID ring;
means for detecting an even harmonic component of the modulated voltage across the terminals of said SQUID ring;
current setting means for adjusting the value of the current from said bias current source so that a peak level or a root-mean square of said even harmonic component of a voltage generated between terminals of the SQUID ring becomes the maximum value or a preset reference value; and
comparing means for producing an abnormal operation detected output when the level of said even harmonic component is smaller than the present reference value.

9. A SQUID magnetometer according to claim 7, wherein said current setting means performs an adjustment operation for the current value of said bias current source for a predetermined period and then fixes the current value.

10. A SQUID magnetometer according to claim 8, wherein said current setting means further includes means for inhibiting said comparing means from producing the abnormal operation detected output during the adjustment operation for the current value of said bias current source.

11. A weak magnetic field measuring system comprising:
a plurality of magnetic flux detecting coils dispersively disposed in a predetermined space;
a plurality of dc-SQUID magnetometers magnetically coupled with said plurality of magnetic flux detecting coils and which produce picked up magnetic flux detected signals;
a plurality of abnormal operation detecting means respectively coupled to each of said plurality of dc-SQUID magnetometers detecting the even harmonic components of the output across the terminals of each of said SQUIDs and producing abnormal operation detected outputs indicating that the corresponding dc-SQUID magnetometers abnormally operate when the levels of the even harmonic components are lower than a predetermined threshold value; and
data processing means which receives detected signals from said plurality of dc-SQUID magnetometers and abnormal operation detected signals from said plurality of abnormal operation detecting means and estimates the current distribution within said predetermined space on the basis of the detected signals from the SQUID magnetometers left after the exclusion of the abnormal operation detected output producing SQUID magnetometers from said plurality of dc-SQUID magnetometers.

12. A weak magnetic field measuring system according to claim 11, further comprising means which responds to the outputs of said plurality of abnormal operation detecting means and generates an alarm output when the number of the abnormal operation detected output producing ones of said plurality of dc-SQUID magnetometers reaches a predetermined value.

13. A weak magnetic field measuring system comprising:
a plurality of magnetic flux detecting coils dispersively disposed in a predetermined space;
a plurality of dc-SQUID magnetometers magnetically coupled with said plurality of magnetic flux detecting coils and which produce picked up magnetic flux detected signals;
a plurality of detecting means each of which is respectively coupled with each of said plurality of dc-SQUID magnetometers and detect the even harmonic components of the outputs across the terminals of said SQUIDs;
bias current setting means for converging the values of the DC bias currents to the corresponding dc- SQUID magnetometers so that the output levels from said even harmonic component detecting means become around a reference value;

a plurality of abnormal operation detecting means for producing abnormal operation detected outputs indicating that the corresponding dc-SQUID magnetometers abnormally operates when the output levels of the said even harmonic component detecting means are lower than a predetermined threshold value; and data processing means which receives detected signals from said plurality of dc-SQUID magnetometers and abnormal operation detected signals from said plurality of abnormal operation detecting means and estimates the current distribution within said predetermined space on the basis of the detected signals from the SQUID magnetometers left after the exclusion of the abnormal operation detected output producing SQUID magnetometers from said plurality of dc-SQUID magnetometers.

14. A weak magnetic field measuring system according to claim 13, further comprising means which responds to the outputs of said plurality of abnormal operation detecting means and produces an alarm output when the number of abnormal operation detected output producing ones of said plurality of dc-SQUID magneto-meters reaches a predetermined value.

* * * * *